(12) United States Patent  
Subramanian et al.

(10) Patent No.: US 7,723,607 B2
(45) Date of Patent: May 25, 2010

(54) HIGH PERFORMANCE THERMOELECTRIC MATERIALS AND THEIR METHOD OF PREPARATION

(75) Inventors: Munirpallam Appadorai Subramanian, Kennett Square, PA (US); Tao He, Wilmington, DE (US); James J. Krajewski, Somerville, NJ (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 1320 days.

(21) Appl. No.: 11/106,243

(22) Filed: Apr. 14, 2005

(65) Prior Publication Data

US 2005/0229963 A1    Oct. 20, 2005

Related U.S. Application Data

(60) Provisional application No. 60/561,944, filed on Apr. 14, 2004.

(51) Int. Cl.
*H01L 35/20* (2006.01)
(52) U.S. Cl. .................. 136/240; 136/224; 136/200
(58) Field of Classification Search .......... 419/33, 419/56
See application file for complete search history.

(56) References Cited

U.S. PATENT DOCUMENTS

| 5,064,476 | A | 11/1991 | Recine |
| 5,171,372 | A | 12/1992 | Recine |
| 5,441,576 | A | 8/1995 | Bierschenk |
| 5,576,512 | A | 11/1996 | Doke |
| 5,610,366 | A | 3/1997 | Fleurial |
| 5,747,728 | A | 5/1998 | Fleurial |
| 5,769,943 | A | 6/1998 | Fleurial |
| 5,965,841 | A | 10/1999 | Imanishi |
| 6,188,011 | B1 | 2/2001 | Nolas |

(Continued)

FOREIGN PATENT DOCUMENTS

EP    0 874 406 A2    10/1998

(Continued)

OTHER PUBLICATIONS

Rowe et al., "Thermoelectric Properties of Hot-Pressed YbA13 Compound Over Temperature Range 150-800 K," 16[16] International Conference on Thermoelectrics, IEEE (1997) pp. 528-531.

(Continued)

*Primary Examiner*—Jennifer K Michener
*Assistant Examiner*—Miriam Berdichevsky

(57) ABSTRACT

The present invention provides an indium-doped $Co_4Sb_{12}$ skutterudite composition in which some Co on the cubic lattice structure may be replaced with one or more members of the group consisting of Fe, Ni, Ru, Rh, Pd, Ir and Pt; some Sb on the planar rings may be replaced by one or more members of the group consisting of Si, Ga, Ge and Sn; and a second dopant atom is selected from a member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu. The composition is useful as a thermoelectric material. In preferred embodiments, the composition has a figure of merit greater than 1.0. The present invention also provides a process for the production of the composition, and thermoelectric devices using the composition.

33 Claims, 8 Drawing Sheets

U.S. PATENT DOCUMENTS

| | | | |
|---|---|---|---|
| 6,207,886 | B1 | 3/2001 | Kusakabe et al. |
| 6,207,888 | B1 | 3/2001 | Nolas |
| 6,225,550 | B1 | 5/2001 | Hornbostel et al. |
| 6,342,668 | B1 | 1/2002 | Fleurial et al. |
| 6,369,314 | B1 | 4/2002 | Nolas |
| 2003/0168641 | A1 | 9/2003 | Funahashi et al. |
| 2005/0121066 | A1 | 6/2005 | He |
| 2005/0123431 | A1 | 6/2005 | He |

FOREIGN PATENT DOCUMENTS

| | | |
|---|---|---|
| EP | 0 948 061 A2 | 10/1999 |
| JP | 57179023 A | 4/1982 |
| JP | 4-62981 A | 2/1992 |
| JP | 08057290 A | 5/1996 |
| JP | 2001102642 A | 4/2001 |
| JP | 2002026400 A | 1/2002 |
| WO | WO 2005/057673 A1 | 6/2005 |

OTHER PUBLICATIONS

He et al., "Origin of low thermal conductivity in a-Mn: Enhancing the ZT of YbA13 and CoSb3 Mn addition," 2005 International Conference on Thermoelectrics, IEEE (2005) pp. 437-442.

Brian C. Sales, "Novel thermoelectric materials," Current Opinion on Soild State and Materials Science, (1997). pp. 284-289, vol. 2.

Y.K. Kuo et al., "Thermoelectric properties of binary Cd-Yb quasicrystals and CD6 YB," Journal of Applied Physics, 2004, pp. 1900-1905, vol. 95.

Koji Akai et al., Effects of Defects and Impurities on Electronic Properties in C0SB3, $16^{th}$ International Conference on Thermoelectrics, 1997, pp. 334-337.

Akai et. al., Proceedings of the $17^{th}$ International Conference on Thermoelectrics, 1998, pp. 105-108.

Akai et. al., Effects of Defects and Impurities on Electronic Properties in Skutterudites, $17^{th}$ International Conference on Thermoelectrics, 1998, pp. 105-108.

B.C. Sales et. al., Filled Skutterudite Antimonides: A New Class of Thermoelectric Materials, Science, 1996, pp. 1325-1328, vol. 272.

Lidong Chen, Recent Advances in Filled Skutterudite Systems, $21^{st}$ International Conference on Thermoelectronics, 2002, pp. 42-47.

Ctirad Uher, In Search of Efficient N-Type Skutterudite Thermoelectrics, $21^{st}$ International Conference on Thermoelectronics, 2002, pp. 35-41.

Jeffrey S. Dyck et al., Thermoelectric Properties of the N-Type Filled Skutterudite Ba 0.3 Co4 Sb12 Doped With Ni, Journal of Applied Physics, 2002, pp. 3698-3705, vol. 91.

The measured Seebeck coefficients in the temperature range of 300 – 600 K.

The measured electrical resistivities in the temperature range of 300 – 600 K

The measured thermal conductivities in the temperature range of 300 – 600 K

The calculated figure of merit ZT in the temperature range of 300 – 600 K.

ial Application No. 60/561,944, filed Apr. 14, 2004, which is
HIGH PERFORMANCE THERMOELECTRIC MATERIALS AND THEIR METHOD OF PREPARATION This application claims the benefit of U.S. Provisional Application No. 60/561,944, filed Apr. 14, 2004, which is incorporated in its entirety as a part hereof for all purposes.

FIELD OF THE INVENTION

The present invention provides an indium-doped $Co_4Sb_{12}$ skutterudite composition in which some Co on the cubic lattice structure may optionally be replaced with one or more members of the group consisting of Fe, Ni, Ru, Rh, Pd, Ir and Pt; some Sb on the planar rings may optionally be replaced by one or more members of the group consisting of Si, Ga, Ge and Sn; and both unfilled subcells are filled with dopant atoms where the indium dopant atom in some subcells is replaced by a member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu. A composition of this invention is useful as a thermoelectric electric material. In a preferred embodiment, a composition of this invention has a figure of merit greater than 1.0 when measured at temperature, for example, of about 573 K. The present invention also provides a process for the production of the composition, and thermoelectric devices using the composition.

BACKGROUND OF THE INVENTION

Thermoelectrics is involved with thermoelectric converters, which cause the generation of electric power by the Seebeck effect and refrigeration by the Peltier effect. The performance of thermoelectric conversion materials is evaluated by ZT (the figure of merit), which is expressed by the equation $ZT=\sigma S^2 T/\kappa$ where $\sigma$, S, $\kappa$ and T are the electrical conductivity, Seebeck coefficient, thermal conductivity and absolute temperature, respectively, of the material. Materials with a large Seebeck coefficient and high electrical conductivity, but low thermal conductivity are desired.

As of today, the thermoelectric materials most commonly in use, such as alloys of $Bi_2Te_3$, have ZT values that seldom, if ever, exceed 1. They operate with poor Carnot efficiency of about 10% when compared to compressor-based refrigerators.

Akai et al in *Proceedings of the 17th International Conference on Thermoelectrics* (1998, pages 105-108) characterizes indium-doped cobalt antimonide produced by a solid phase reaction followed by hot-pressing. Although these materials have been used as thermoelectric materials with some effect, a need remains for thermoelectric materials having better properties.

U.S. Pat. No. 6,369,314 discloses semiconductor materials, such as skutterudite structures, useful in fabricating thermoelectric devices that are composed in part of doped cobalt antimonide compositions.

As a result of the search for improved thermoelectric materials, a composition is proposed in this invention in which cobalt antimonide is doped with indium and a second dopant. It is found that the compositions of this invention have properties making them desirable for use as thermoelectric materials.

SUMMARY OF THE INVENTION

One embodiment of this invention is a composition of cobalt, antimony and indium and one or more elements selected from the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu.

Another embodiment of this invention is a composition of matter having a skutterudite cubic lattice structure comprised of a purality of cubic unit cells, wherein
 (a) the cubic lattice of a cubic unit cell is comprised of Co, or Co and one or more members of the group consisting of Fe, Ni, Ru, Rh, Pd, Ir and Pt;
 (b) a cubic unit cell is comprised of atomic crystallograhphic sites arranged in eight subcells;
 (c) six subcells in the cubic unit cell are comprised of Sb, or Sb and one or more members of the group consisting of Si, Ga, Ge and Sn;
 (d) a seventh subcell in the cubic unit cell is comprised of In; and
 (e) an eighth subcell in the cubic unit cell is comprised of a member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu.

A composition of this invention may be prepared by admixing the above described components, and may be used as a power generation device, a refrigeration device, a heating device or a temperature sensor.

This invention also provides a method of preparing a doped composition of indium, cobalt and antimony, comprising selecting as the dopant one or more members of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu; optionally replacing some of the cobalt with one or more members of the group consisting of Fe, Ni, Ru, Rh, Pd, Ir and Pt; optionally replacing some of the antimony with one or more members of the group consisting of Si, Ga, Ge and Sn; and admixing the selected dopant(s) with the composition. The invention also provides a method of improving the figure of merit of a composition that comprises indium, cobalt and antimony.

DETAILED DESCRIPTION OF EMBODIMENTS OF THE INVENTION

Figure 1:
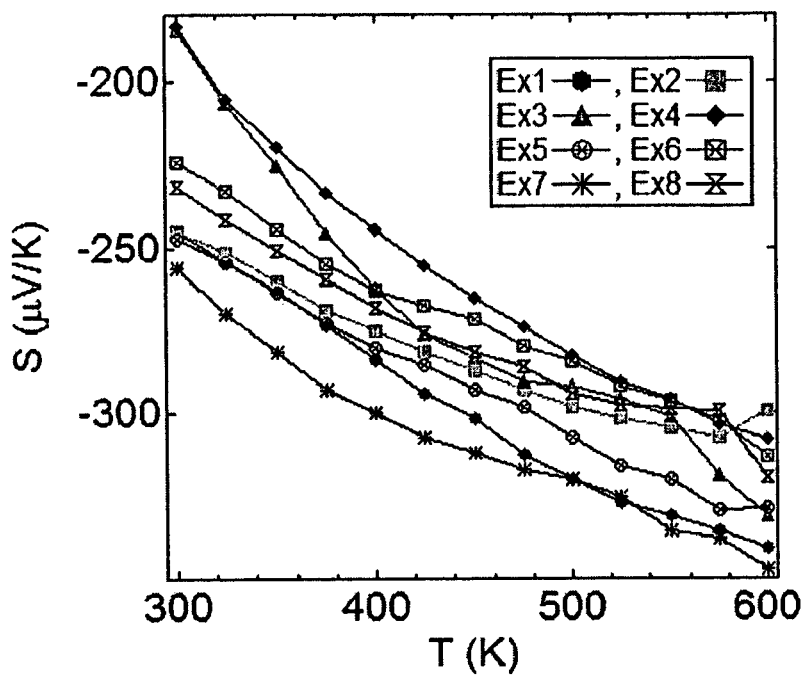
FIG. 1 is a chart of the measured Seebeck coefficients of selected materials in the temperature range of 300-600 K.

The present invention provides an intermetallic composition in which cobalt, antimony and indium are admixed with one or more elements selected from the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu. In various optional embodiments, some of the cobalt may be replaced with one or more members of the group consisting of Fe, Ni, Ru, Rh, Pd, Ir and Pt; and/or some of the antimony may be replaced with one or more members of the group consisting of Si, Ga, Ge and Sn In one particular embodiment, the present invention provides a composition described generally by the formula $Co_{4-m}A_m Sb_{12-n}X_n In_x M_y$, where A is selected from one or more members of the group consisting of Fe, Ni, Ru, Rh, Pd, Ir and Pt; X is selected from one or more members of the group consisting of Si, Ga, Ge and Sn; M is selected from one or more members of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu; $0 \leq m \leq 1$; $0 \leq n \leq 9$; $0 < x < 1$; $0 < y < 1$; and $0 < x + y \leq 1$. Alternatively, $0 < x \leq 0.3$, $0 < y \leq 0.3$, $0 \leq n \leq 6$ and/or $0 \leq n \leq 3$.

In another particular embodiment, this invention provides a composition comprising:
- about 23.5 to about 25 atomic percent Co,
- about 70.5 to about 75 atomic percent Sb,
- about 0.001 to about 0.06 atomic percent of In, and
- about 0.001 to about 0.06 atomic percent of one or more elements selected from the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu. In various optional forms of this embodiment, some of the cobalt may be replaced with one or more members of the group consisting of Fe, Ni, Ru, Rh, Pd, Ir and Pt; and/or some of the antimony may be replaced with one or more members of the group consisting of Si, Ga, Ge and Sn The compositions of this invention are part of a family of materials known as skutterudites, which are made up of a plurality of cubic unit cells. In the crystal structure of these compositions, eight cobalt atoms are arranged in a simple cubic lattice structure to form a cubic unit cell. The eight cobalt atoms have eight symmetric spots, or subcells of a unit cell, six of which contain a 4-member planar ring, or platelet, that is formed as a square. The four atoms forming the planar ring are either all antimony, or antimony and one or members of the group consisting of Si, Ga, Ge and Sn. In the six subcells containing a 4-member planar ring, the six planar rings are arranged with two each oriented in the xy-plane, in the yz-plane and in the xz-plane. As only six of the subcells in the lattice of the $Co_8$ unit cell are filled with the 4-member planar rings, two are empty. When atoms are placed in the empty subcells, the composition is known as a filled skutterudite. In the composition of this invention, some empty subcells are filled with indium and some are filled with a member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu.

Figure 5:
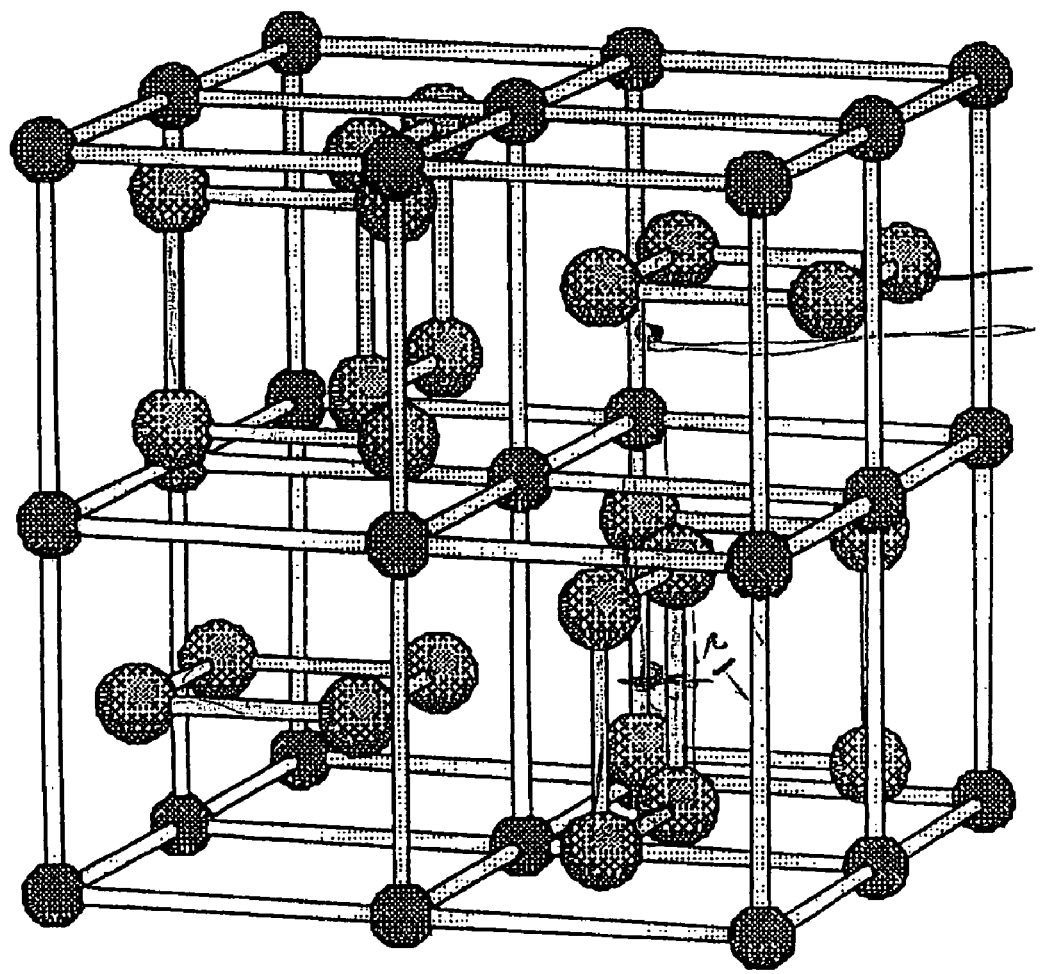
FIGS. 5~9 show the structure of a skutterudite composition.
Figure 6:
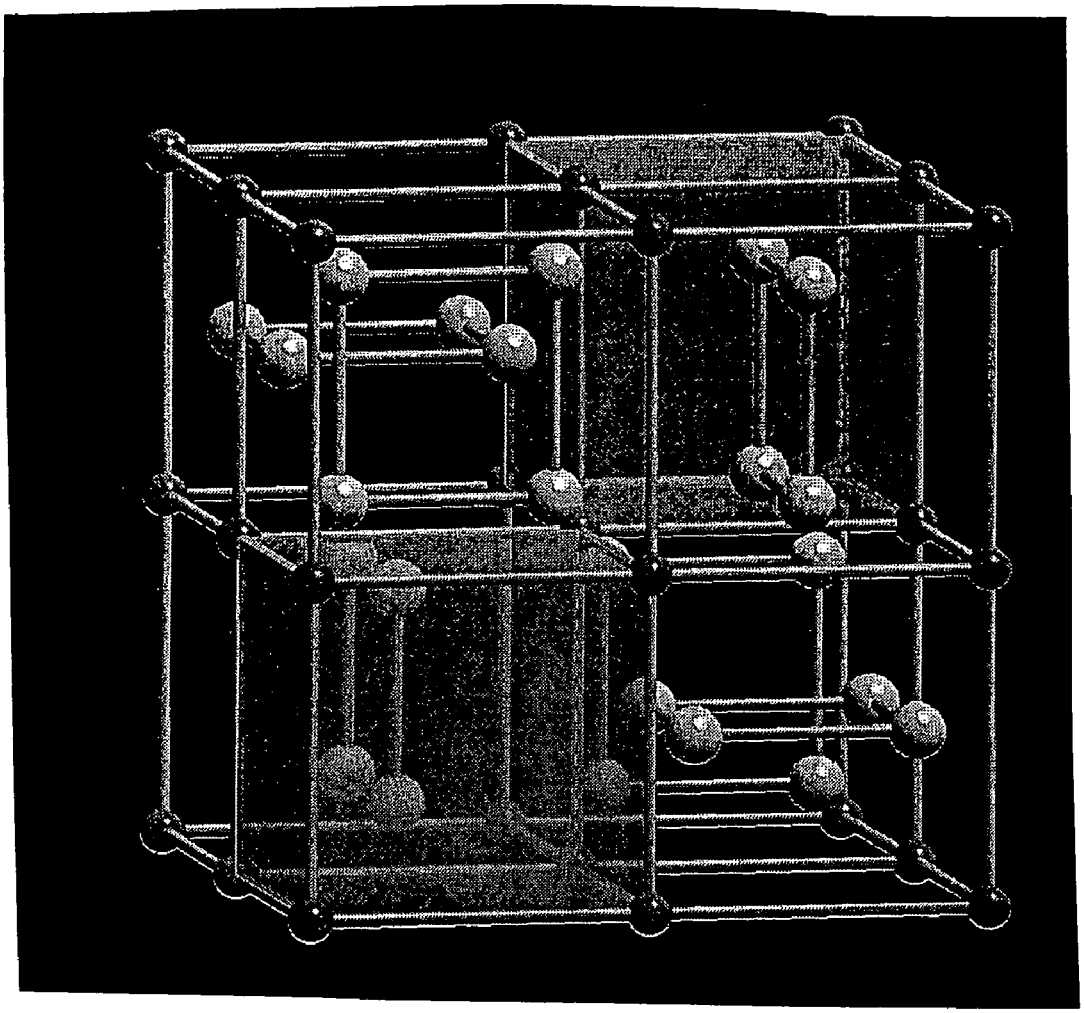
Figure 7:
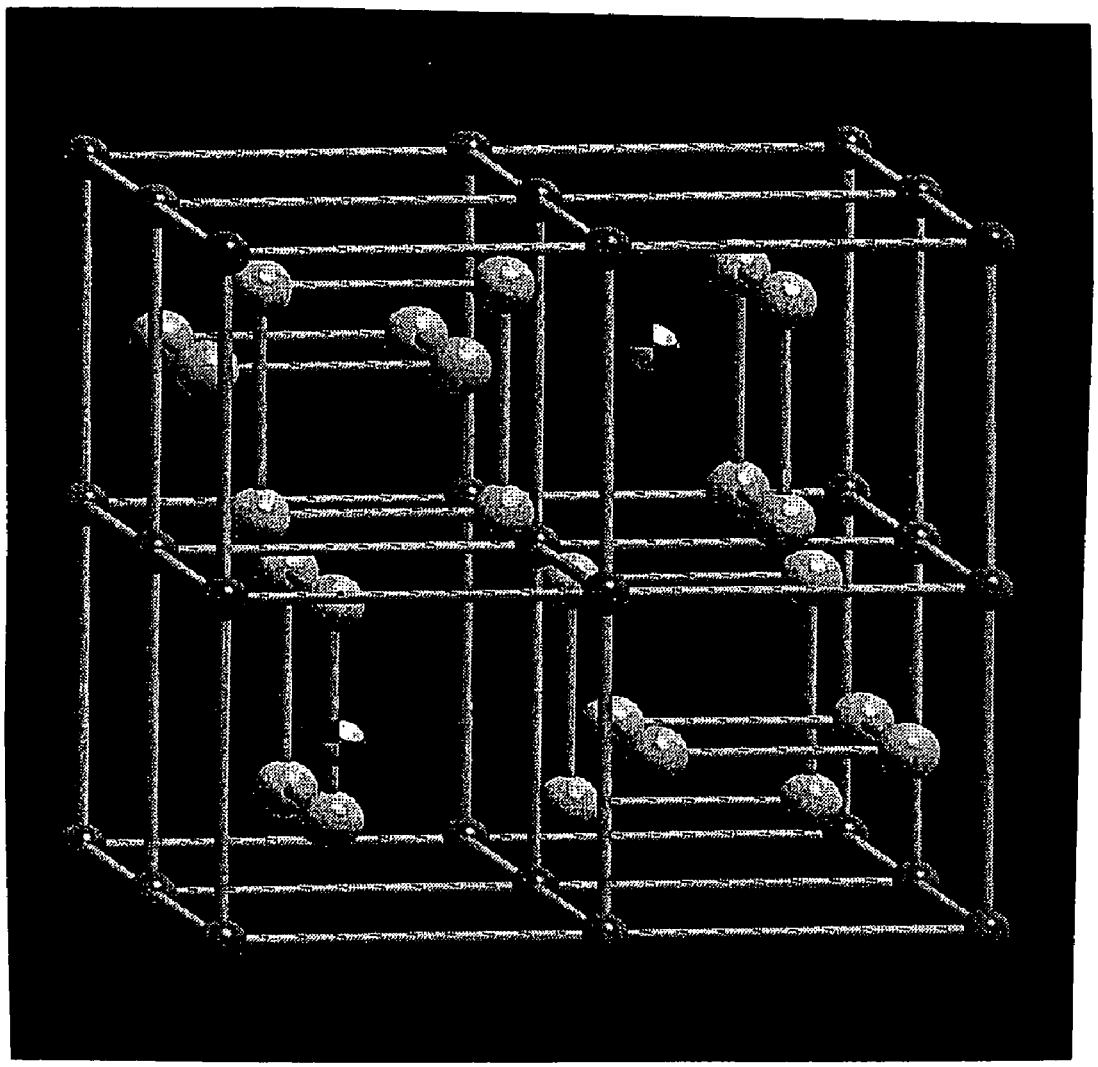

The structure of a unit cell of the composition of this invention is better understood by reference to FIGS. 5~9. In FIGS. 5~7, the cobalt atoms forming the corners of the unit cell and the corners of the eight subcells are dark in color, and the atoms forming the four members of the six planar rings are light in color. In FIG. 6, the empty subcells before the addition of indium or the metal component M are indicated by shading. In FIG. 7, filled subcells after the addition of indium or the metal component M are indicated by a sphere having a black and white colored pattern.

Figure 8:
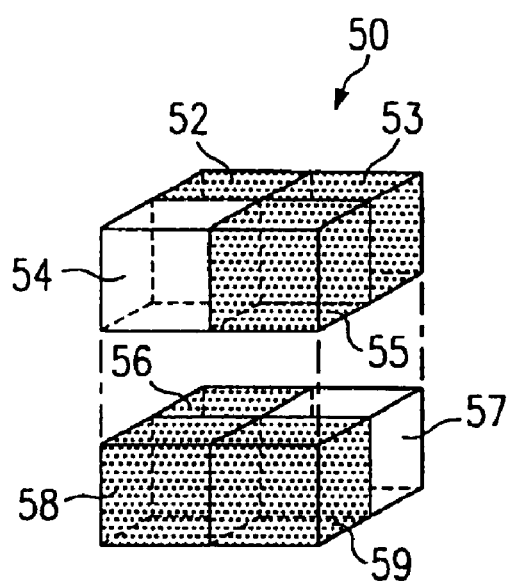
Figure 9:
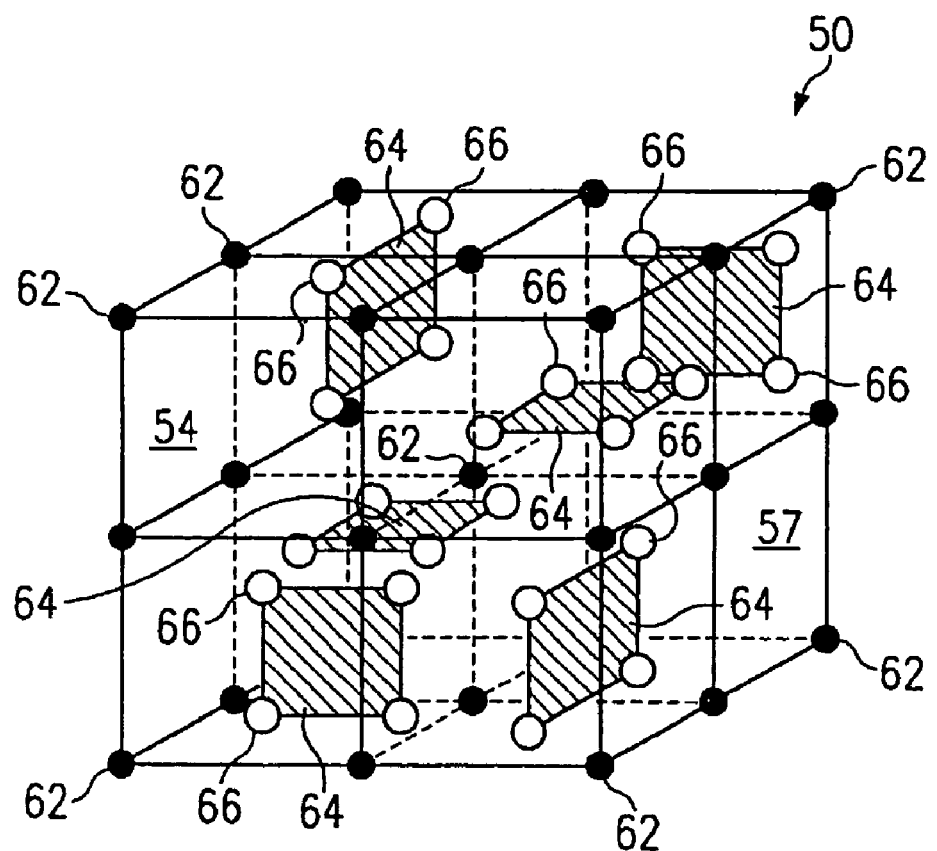

FIGS. 8 and 9 give a further, exploded schematic drawing of a typical skutterudite crystal lattice structure wherein unit cell 50 has eight subcells 52, 53, 54, 55, 56, 57, 58 and 59. Subcells 52, 53, 55, 56, 58 and 59 are shown with dots to indicate that these subcells have been "filled". Subcells 54 and 57 are shown as the open or "unfilled" void spaces or vacancies in the lattice structure of unit cell 50 before the addition of indium or the metal component M in the composition of this invention.

The skutterudite crystal lattice structure of unit cell 50 includes the generally cubic lattice formed in part by cobalt atoms 62, and (as more specifically shown in FIG. 9), it is defined, in part, by thirty-two atomic crystallographic sites where eight positions may be occupied by cobalt atoms 62 and twenty-four positions may be occupied by semi-metal and/or nonmetal atoms 66 (antimony and/or the component X) in the 4-member planar rings. The cobalt atoms 62 cooperate with each other to define the subcells 52~59 of unit cell 50. The dimension of unit cell 50 for a skutterudite crystal lattice structure typically ranges from 7.7 to 9.4 angstroms.

Each of the six planar rings 64 included in unit cell 50 is defined in part by four non-metal and/or semimetal atoms 66. Each cobalt atom 62 typically has six neighboring semimetal or non-metal atoms 66. Non-metal and/or semi-metal atoms 66 each have two adjacent non-metal atoms 66 and two adjacent cobalt atoms 62. As set forth above, the non-metal and/or semi-metal atoms 66 are primarily antimony but may also include Si, Ga, Ge and/or Sn.

Since the skutterudite crystal lattice of unit cell 50 generally has only six planar rings 64, two of the subcells associated with the unit cell 50 are shown in FIG. 9 as empty. Unit cell 50 is shown with subcells 52, 53, 55, 56, 58 and 59 filled with a planar ring 64. The dimensions of a planar ring 64 may exceed the size of the associated subcell, and may actually extend beyond the sides thereof. Subcells 54 and 57 are shown as unfilled or empty, and constitute cavities or vacancies within unit cell 50. The center of each normally unfilled subcell 54 and 57 is coordinated by twelve non-metal and/or semimetal atoms 66 since the planar rings 64 generally extend beyond the edges of their respective subcells, but void subcells 54 and 57 are large enough to hold at least one atom selected as set forth herein.

No effort is made to control the distribution of In and M among the vacant subcells of the various unit cells contained in the skutterudite composition of this composition. Some unit cells may thus have In in both of the vacant subcells, some may have In in one subcell and M (the same or different than others) in the other subcell, and some may have M (the same or different) in both of the vacant subcells. In and M are both nevertheless present in the composition of this invention, and the location of any In atom present in the composition, and the location of any M atom present, will be in one of the two vacant subcells of a unit cell.

As the metal component M may be selected as one or more members of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu, more than one M may be used along with In as a dopant element in the composition. As stated above, however, whatever the identity of any M that is contained in the composition, and regardless of the number of different Ms used, the location of any M atom present will be in one of the two vacant subcells of a cubic unit cell. M may therefore be selected from a subgroup of the foregoing whole group of any size (2, 3 or 4, for example), where the subgroup is formed by omitting any one or more members from the whole group as set forth in the list above. As a result, M may in such instance not only be selected from any subgroup of any size that may be formed from the whole group as set forth in the list above, but M may also be selected in the absence of the members that have been omitted from the whole group to form the subgroup. The subgroup formed by omitting various members from the whole group in the list above may, moreover, be an individual member of the whole group such that M is selected in the absence of all other members of the whole group except the selected individual member. In various preferred embodiments, M may be selected as individual members, or subgroups of any size, from the group consisting of Sc, La, Ce, Nd and Yb.

In the same manner as set forth above with respect to M, the optional component X may similarly be selected as any subgroup of any size from the whole group of Si, Ga, Ge and Sn. Moreover, although the discussion above concerning the cubic lattice structure of a skutterudite composition referred to Co atoms as forming the cubic unit cell, some of the Co atoms may optionally be replaced with one or more members of the group consisting of Fe, Ni, Ru, Rh, Pd, Ir and Pt. The description of this invention should therefore be read with the understanding that references to Co alone should not be interpreted to exclude the optional presence of one or more of the replacement atoms listed above. In the same manner as set forth above with respect to M, the optional component A may thus similarly be selected as any subgroup of any size from the whole group of Fe, Ni, Ru, Rh, Pd, Ir and Pt.

The compositions of this invention, as n-type thermoelectric materials, can be used to manufacture a refrigerator, heater generator or temperature sensor in an electrical arrangement with a p-type thermoelectric material such as $Ce_{0.9}Fe_3CoSb_{12}$, Si—Ge alloys or tellurium/antimony/germanium/silver materials. The compositions of this invention may used for this purpose in the same manner as previously known thermoelectric materials. Examples of thermoelectrice devices are discussed, for example, in U.S. Pat. Nos. 5,064,476; 5,441,576; and 5,576,512

An assembly for a simple thermoelectric device generally includes two dissimilar materials such as N-type and P-type thermoelectric semiconductor elements. Heating and cooling with a thermoelectric device occurs by arranging the thermoelectric elements in an alternating N-element and P-element electrical configuration, with the thermoelectric elements electrically coupled in series and thermally in parallel. The Peltier effect occurs in the thermoelectric devices when a DC voltage applied to the N-type and P-type elements results in current flow through the serial electrical connection and heat transfer across the N-type and P-type elements in the parallel thermal connection. In a typical thermoelectric element array, the direction of net current flow through the thermoelectric elements determines the direction of heat transfer.

Thermoelectric coolers include a matrix of thermoelectric couples formed of n-type and p-type semiconductor material. The thermoelectric couples are connected electrically in series and thermally in parallel. The thermoelectric couples are sandwiched between two ceramic plates. The two ceramic plates define either the cold side or hot side depending on the connection of the dc voltage. With a positive dc voltage applied to the n-type thermoelement, electrons pass from the p- to the n-type thermoelement, and the cold side temperature will decrease as heat is absorbed. Cooling is proportional to the current and the number of thermoelectric couples, and occurs when electrons pass from a low energy level in the p-type thermoelement to a higher energy level in the n-type thermoelement. The heat is then conducted through the thermoelement to the hot side, and liberated as the electrons return to a lower energy level in the p-type thermoelement. To keep the device working, it is necessary to remove the heat dissipated at the hotside. Thus, a heat sink is attached to the hot side for heat removal.

Figure 10:
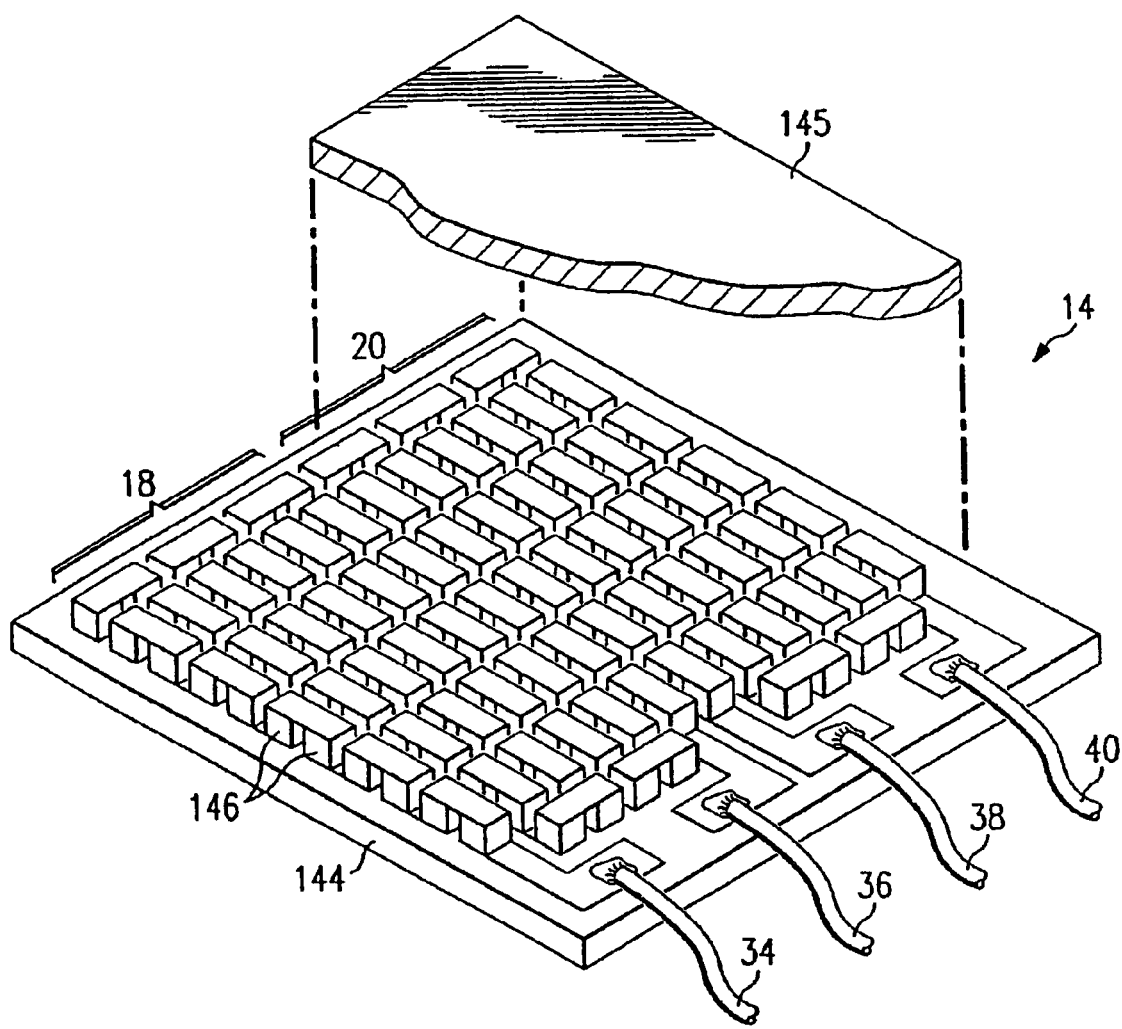
FIG. 10 shows a thermoelectric device.

FIG. 10 shows a perspective view of a thermoelectric assembly 14. Thermoelectric assembly 14 includes heat transfer plates 144 and 145 with thermoelectric elements 146 disposed between heat transfer plates 144 and 145. Heat transfer plate 145 in FIG. 10 is shown in portion and in elevation so that the arrangement of thermoelectric elements 146 can be seen. Thermoelectric elements 146 are in a serial electrical connection and a parallel thermal connection between heat transfer plates 144. Thermoelectric assembly 14 is divided into two thermoelectric devices 18 and 20. In some embodiments of thermoelectric assembly 14, heat transfer plate 145 will be two separate plates divided at the interface between thermoelectric devices 18 and 20. Thermoelectric device 18 is supplied by conductors 34 and 36, and thermoelectric device 20 is supplied by conductors 38 and 40. The number of thermoelectric elements 146 in thermoelectric assembly 14 may be varied to achieve the desired power rating for thermoelectric assembly 14.

In a refrigerator, the thermoelectric material is typically mounted between two heat transfer plates, typically made of materials such as ceramics. One plate is located at the region to be cooled. The other plate is located where the heat is to be rejected. Current of the appropriate polarity is passed through the thermoelectric material, cooling the desired location. If the polarity of the current is reversed, the previously cooled plate will be heated, thus providing a heater, and the plate rejecting the heat will be cooled. To use a thermoelectric material as a generator, the thermoelectric material is again mounted between two plates. One plate is exposed to a high temperature source while the second plate is maintained at a lower temperature. Electrical power can be obtained from electrical connections across the sides of the thermoelectric material in the temperature gradient.

The compositions of this invention can be synthesized by the following procedure. Powders, preferably of high purity, of Co, Sb, In, and one or more metals selected from the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu are mixed thoroughly in stoichiometric ratio. Where the optional components A and X are present, they are added to the mixture as well. The components can be added to the mixture in any order. The mixed powder of starting materials is put into an alumina crucible, which is in turn put into an alumina boat. Another crucible containing pure Sb metal is also put into the boat to compensate for the evaporation of Sb. The boat is then inserted into a quartz reactor with the Sb containing crucible facing the gas inlet. The powder is calcined at about 610° C. for about 12 hours, and then about 675° C. for about 36 hours under a gas mixture of about 5 vol % $H_2$ and about 95 vol % Ar. The calcined powder is reground and pressed into disks that are about 12.8 mm in diameter and about 1 to 2 mm thick. The disks are sintered at about 675° C. for about 4 hours under the same gas mixture. In both the calcining and sintering steps, the heating rate is about 240° C./hour from room temperature to the calcining or sintering temperature. After the desired reaction time, the samples are furnace cooled to room temperature. Synchrotron X-ray powder diffraction data, obtained for example at room temperature (25 C.), shows all the In, metal, Co and Sb phases of the composition crystallize in a cubic Im-3 structure. Powders of the components to be incorporated into the compositions of this invention may be purchased from a supplier such as Aldrich, Johnson Matthey, Fisher or Alfa.

The electrical resistivity of a thermoelectric material may be measured in the range of about 300 to 600 K by the Van Der Pauw technique using a commercial apparatus obtainable from MMR Technologies Inc. of Mountain View, Calif. Silver paint is used to attach the leads to the pellet. The Seebeck coefficient of a thermoelectric material may be measured in the same temperature range. A pellet is placed between silver electrodes that are electrically isolated from each other. One electrode is heated by a resistive heater to develop a thermal gradient across the sample, which varies from 5 to 10 degrees Kelvin at each temperature set point. The testing assembly is placed in a temperature-controlled oven under Ar. The voltage developed may be measured with a Keithley 181 nanovoltmeter manufactured by Keithley Instruments of Cleveland, Ohio. When the measured Seebeck coefficient is negative, n-type conduction is indicated. The thermal conductivity of a thermoelectric material may be determined in a Netzsch Laser Microflash with a reference material of 1-mm or 2-mm gold-sputtered, graphite-coated Pyrex glass. This instrument is manufactured by Netzsch Instruments Inc. of Burlington, Mass.

The advantageous effects of this invention are demonstrated by a series of examples, as described below. The embodiments of the invention on which the examples are based are illustrative only, and do not limit the scope of the invention.

EXAMPLES 1-8

Compositions of the formula $In_xM_yCo_4Sb_{12}$ are made in Examples 1-8 using the following procedure. For each example, amounts of the starting metals In, M, Co and Sb as shown in Table 1 are weighed according to the stoichiometric ratios and mixed thoroughly in an agate mortar. The gram amounts for a 2-gram sample size of the starting materials used are shown in Table 1.

TABLE 1

| Ex | Composition | Indium metal (mg) | $M_1$ (mg) | $M_2$ (mg) | Cobalt metal (gram) | Antimony metal (gram) | ZT at 573K |
|---|---|---|---|---|---|---|---|
| 1 | $In_{0.2}Ce_{0.1}Co_4Sb_{12}$ | 26.49 | 16.16 | — | 0.27194 | 1.6854 | 1.6 |
| 2 | $In_{0.2}Ce_{0.2}Co_4Sb_{12}$ | 26.28 | 32.07 | — | 0.26976 | 1.67189 | 1.7 |
| 3 | $In_{0.25}Ce_{0.1}Co_4Sb_{12}$ | 33.00 | 16.11 | — | 0.27104 | 1.67984 | 1.4 |
| 4 | $In_{0.25}Ce_{0.2}Co_4Sb_{12}$ | 32.74 | 31.96 | — | 0.26888 | 1.66642 | 1.5 |
| 5 | $In_{0.2}Ce_{0.1}Yb_{0.1}Co_4Sb_{12}$ | 26.23 | 16.00 | 19.76 | 0.26925 | 1.66875 | 1.2 |
| 6 | $In_{0.2}Ce_{0.1}Sm_{0.1}Co_4Sb_{12}$ | 26.26 | 16.03 | 17.20 | 0.26960 | 1.67091 | 1.3 |
| 7 | $In_{0.2}Ce_{0.1}Tb_{0.1}Co_4Sb_{12}$ | 26.25 | 16.02 | 18.17 | 0.26947 | 1.67009 | 1.4 |
| 8 | $In_{0.1}Ce_{0.1}Ho_{0.1}Co_4Sb_{12}$ | 26.24 | 16.01 | 18.85 | 0.26938 | 1.66952 | 1.3 |

In each example, the mixed powder is fired at about 610° C. for about 12 hours, and then at about 675° C. for about 36 hours under a gas mixture of about 5 vol % $H_2$ and about 95 vol % Ar, and is then furnace cooled to room temperature. X-ray powder diffraction patterns are recorded and the data shows all samples crystallized in a cubic Im-3 structure. The calcined powder is reground and pressed into disks that are 12.8 mm in diameter and 1 to 2 mm thick. The disks are sintered at about 675° C. for about 4 hours under the same gas mixture, and are then used for thermal conductivity measurements. Bars of about $1.5 \times 1.5 \times 7$ mm$^3$ size are cut for resistivity and Seebeck coefficient measurements.

Figure 2:
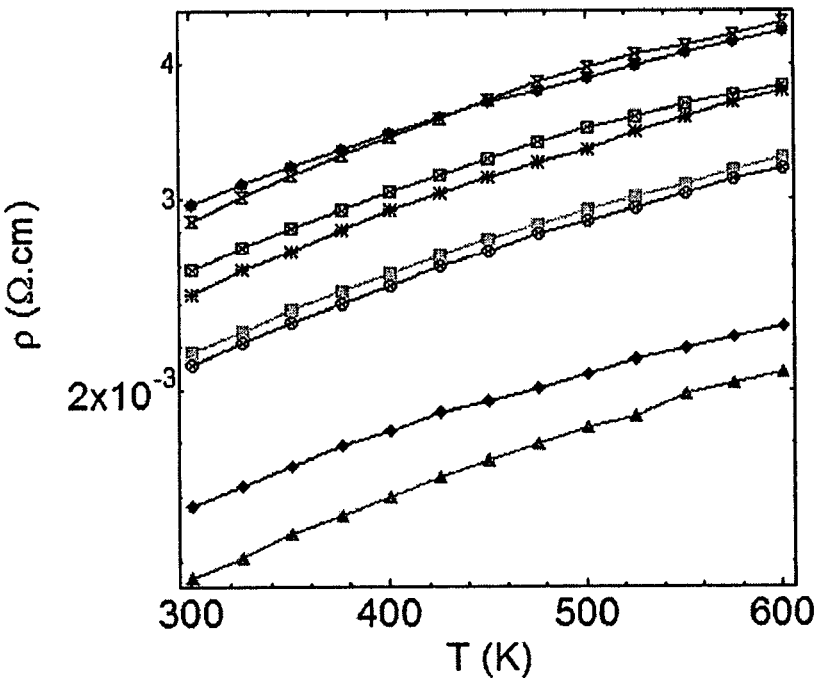
FIG. 2 is a chart of the measured electrical resistivities of selected materials in the temperature range of 300-600 K.
Figure 3:
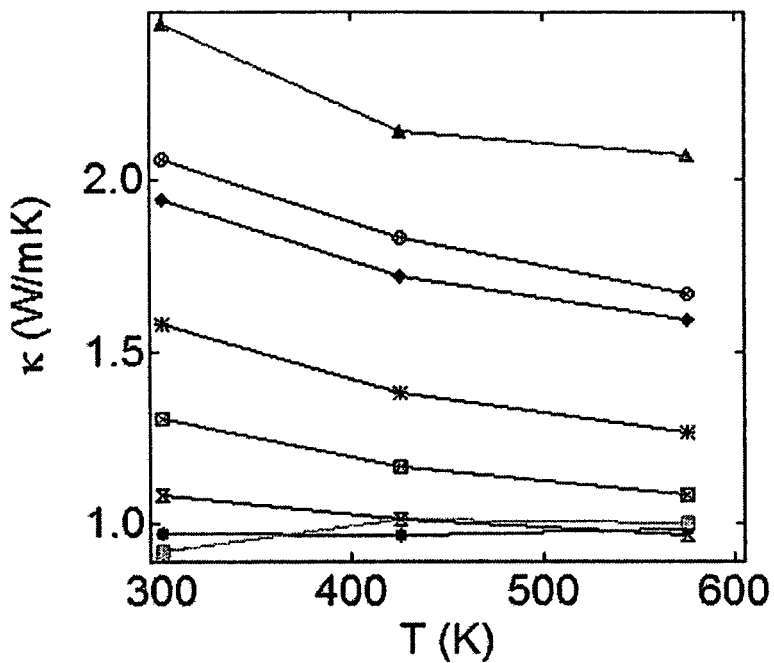
FIG. 3 is a chart of the measured thermal conductivities of selected materials in the temperature range of 300-600 K.
Figure 4:
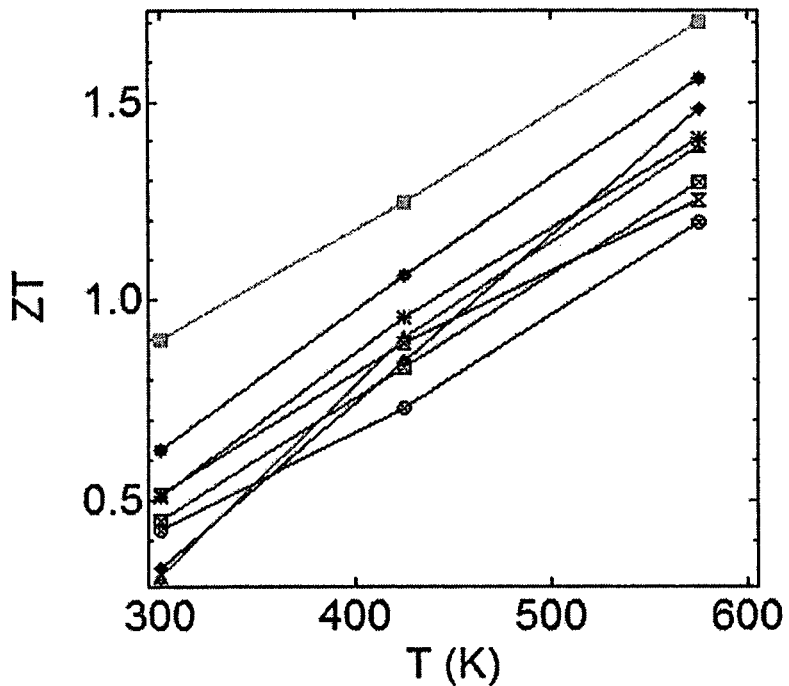
FIG. 4 is a chart of the calculated figure of merit, ZT, of selected materials in the temperature range of 300-600 K.

The measured Seebeck coefficients, electrical resistivities and thermal conductivities for selected samples in the temperature range of about 300-600 K are shown in FIGS. 1, 2 and 3, respectively. The calculated ZT values are shown in FIG. 4. These values are determined by the methods set forth above.

The compositions of this invention have a lower electrical resistivity, lower thermal conductivity and higher Seebeck coefficient than $CoSb_3$ in the temperature range of about 300-600 K. This results in an improvement in the figure of merit from 0.2 (x+y=0) to above 1.0 (x+y>0) when measured at a temperature, for example, of about 573 K.

While not wishing to be bound by any theory, it is believed that, in the compositions of this invention, a reduction in thermal conductivity can be achieved by preparing ternary or quaternary semiconductors in which one or more of the atoms are weakly bound in oversized atomic cages. The "rattling motion" of the caged atoms in the vacant subcells effectively scatters heat-carrying phonons and markedly reduces the lattice contribution to the thermal conductivity; yet at the same time, the framework atoms maintain good electrical conduction.

Where the composition of this invention is stated or described as comprising, including, containing or having certain components, it is to be understood, unless the statement or description explicitly provides to the contrary, that one or more components in addition to those explicitly stated or described may be present in the composition. In an alternative embodiment, however, the composition of this invention may be stated or described as consisting essentially of certain components, in which embodiment components that would materially alter the principle of operation or the distinguishing characteristics of the composition are not present therein. In a further alternative embodiment, the composition of this invention may be stated or described as consisting of certain components, in which embodiment components other than impurities are not present therein.

Where the indefinite article "a" or "an" is used with respect to a statement or description of the presence of a component in the composition of this invention, it is to be understood, unless the statement or description explicitly provides to the contrary, that the use of such indefinite article does not limit the presence of the component in the composition to one in number.

What is claimed is:

1. A cooling device comprising at least two heat transfer plates, a composition disposed between the heat transfer plates, a p-type thermoelectric material disposed between the heat transfer plates, a heat sink, and a power source connected to the composition and to the p-type thermoelectric material; wherein the composition has a skutterudite cubic lattice structure and is described by the formula $Co_{4-m}A_mSb_{12-n}X_nIn_xM_y$, where A is selected from one or more members of the group consisting of Fe, Ni, Ru, Rh, Pd, Ir and Pt; X is selected from one or more members of the group consisting of Si, Ga, Ge and Sn; M is selected from one or more members of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu; $0 \leq m \leq 1$; $0 \leq n \leq 9$; $0 < x < 1$; $0 < y < 1$; and $0 < x+y \leq 1$.

2. A device according to clam 1 wherein the composition is comprised of a purality of cubic unit cells, wherein
   (a) the cubic lattice of a first cubic unit cell is comprised of Co, or Co and one or more members of the group consisting of Fe, Ni, Ru, Rh, Pd, Ir and Pt;
   (b) the first cubic unit cell is comprised of atomic crystallograhphic sites arranged in eight subcells;

(c) six subcells in the first cubic unit cell are comprised of Sb, or Sb and one or more members of the group consisting of Si, Ga, Ge and Sn;

(d) a seventh subcell in the first cubic unit cell is comprised of In; and (e) an eighth subcell in the first cubic unit cell is comprised of a member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu.

3. A device according to claim 2 wherein the composition has a second cubic unit cell, wherein (a) the cubic lattice of the second cubic unit cell is comprised of Co, or Co and one or more members of the group consisting of Fe, Ni, Ru, Rh, Pd, Ir and Pt;

(b) the second cubic unit cell is comprised of atomic crystallograhphic sites arranged in eight subcells;

(c) six subcells in the second cubic unit cell are comprised of Sb, or Sb and one or more members of the group consisting of Si, Ga, Ge and Sn;

(d) a seventh subcell in the second cubic unit cell is comprised of In; and (e) an eighth subcell in the second cubic unit cell is comprised of a different member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu than the eighth subcell in the first cubic unit cell.

4. A device according to claim 2 wherein the composition has a second cubic unit cell, wherein (a) the cubic lattice of the second cubic unit cell is comprised of Co, or Co and one or more members of the group consisting of Fe, Ni, Ru, Rh, Pd, Ir and Pt;

(b) the second cubic unit cell is comprised of atomic crystallograhphic sites arranged in eight subcells;

(c) six subcells in the second cubic unit cell are comprised of Sb, or Sb and one or more members of the group consisting of Si, Ga, Ge and Sn;

(d) a seventh subcell in the second cubic unit cell is comprised of In; and (e) an eighth subcell in the second cubic unit cell is comprised of In.

5. A device according to claim 2 wherein the composition has a second cubic unit cell, wherein (a) the cubic lattice of the second cubic unit cell is comprised of Co, or Co and one or more members of the group consisting of Fe, Ni, Ru, Rh, Pd, Ir and Pt;

(b) the second cubic unit cell is comprised of atomic crystallograhphic sites arranged in eight subcells;

(c) six subcells in the second cubic unit cell are comprised of Sb, or Sb and one or more members of the group consisting of Si, Ga, Ge and Sn;

(d) a seventh subcell in the second cubic unit cell is comprised of a member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu; and (e) an eighth subcell in the second cubic unit cell is comprised of a member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu.

6. A device according to claim 5 wherein the seventh and eighth subcells of the second cubic unit cell are comprised of the same member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu.

7. A device according to claim 5 wherein the seventh and eighth subcells of the second cubic unit cell are comprised of different members of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu.

8. A device according to claim 2 wherein the cubic lattice of the first cubic unit cell is comprised of Co and one or more members of the group consisting of Fe, Ni, Ru, Rh, Pd, Ir and Pt.

9. A device according to claim 2 wherein six subcells in the first cubic unit cell are comprised of 4-member planar rings comprised of Sb and one or more members of the group consisting of Si, Ga, Ge and Sn.

10. A device according to claim 2 wherein an eighth subcell in the first cubic unit cell is comprised of a member of the group consisting of Sc, La, Ce, Yb, Nd, Pd and Y.

11. A device according to claim 1 which comprises a plurality of elements fabricated from the composition, and a plurality of elements fabricated from a p-type thermoelectric material, wherein the elements are arranged in an alternating configuration, and are electrically coupled in series and are thermally coupled in parallel.

12. A heating device comprising at least two heat transfer plates, a composition disposed between the heat transfer plates, a p-type thermoelectric material disposed between the heat transfer plated, and a power source connected to the composition and to the p-type thermoelectric material;

wherein the composition has a skutterudite cubic lattice structure and is described by the formula $Co_{4-m}A_mSb_{12-n}X_nIn_xM_y$, where A is selected from one or more members of the group consisting of Fe, Ni, Ru, Rh, Pd, Ir and Pt; X is selected from one or more members of the group consisting of Si, Ga, Ge and Sn; M is selected from one or more members of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu $0 \leq m \leq 1$; $0 \leq n \leq 9$; $0<x<1$; $0<y<1$; and $0<x+y \leq 1$.

13. A device according to claim 12 wherein the composition is comprised of a plurality of cubic unit cells, wherein (a) the cubic lattice of a first cubic unit cell is comprised of Co, or Co and one or more members of the group consisting of Fe, Ni, Ru, Rh, Pd, Ir and Pt;

(b) the first cubic unit cell is comprised of atomic crystallograhphic sites arranged in eight subcells;

(c) six subcells in the first cubic unit cell are comprised of Sb, or Sb and one or more members of the group consisting of Si, Ga, Ge and Sn;

(d) a seventh subcell in the first cubic unit cell is comprised of In; and (e) an eighth subcell in the first cubic unit cell is comprised of a member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu.

14. A device according to claim 13 wherein the composition has a second cubic unit cell, wherein (a) the cubic lattice of the second cubic unit cell is comprised of Co, or Co and one or more members of the group consisting of Fe, Ni, Ru, Rh, Pd, Ir and Pt;

(b) the second cubic unit cell is comprised of atomic crystallograhphic sites arranged in eight subcells;

(c) six subcells in the second cubic unit cell are comprised of Sb, or Sb and one or more members of the group consisting of Si, Ga, Ge and Sn;

(d) a seventh subcell in the second cubic unit cell is comprised of In; and (e) an eighth subcell in the second cubic unit cell is comprised of a different member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu than the eighth subcell in the first cubic unit cell.

15. A device according to claim 13 wherein the composition has a second cubic unit cell, wherein
    (a) the cubic lattice of the second cubic unit cell is comprised of Co, or Co and one or more members of the group consisting of Fe, Ni, Ru, Rh, Pd, Ir and Pt;
    (b) the second cubic unit cell is comprised of atomic crystallograhphic sites arranged in eight subcells;
    (c) six subcells in the second cubic unit cell are comprised of Sb, or Sb and one or more members of the group consisting of Si, Ga, Ge and Sn;
    (d) a seventh subcell in the second cubic unit cell is comprised of In; and
    (e) an eighth subcell in the second cubic unit cell is comprised of In.

16. A device according to claim 13 wherein the composition has a second cubic unit cell, wherein
    (a) the cubic lattice of the second cubic unit cell is comprised of Co, or Co and one or more members of the group consisting of Fe, Ni, Ru, Rh, Pd, Ir and Pt;
    (b) the second cubic unit cell is comprised of atomic crystallograhphic sites arranged in eight subcells;
    (c) six subcells in the second cubic unit cell are comprised of Sb, or Sb and one or more members of the group consisting of Si, Ga, Ge and Sn;
    (d) a seventh subcell in the second cubic unit cell is comprised of a member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu; and
    (e) an eighth subcell in the second cubic unit cell is comprised of a member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu.

17. A device according to claim 16 wherein the seventh and eighth subcells of the second cubic unit cell are comprised of the same member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu.

18. A device according to claim 16 wherein the seventh and eighth subcells of the second cubic unit cell are comprised of different members of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu.

19. A device according to claim 13 wherein the cubic lattice of the first cubic unit cell is comprised of Co and one or more members of the group consisting of Fe, Ni, Ru, Rh, Pd, Ir and Pt.

20. A device according to claim 13 wherein six subcells in the first cubic unit cell are comprised of 4-member planar rings comprised of Sb and one or more members of the group consisting of Si, Ga, Ge and Sn.

21. A device according to claim 13 wherein an eighth subcell in the first cubic unit cell is comprised of a member of the group consisting of Sc, La, Ce, Yb, Nd, Pd and Y.

22. A device according to claim 12 which comprises a plurality of elements fabricated from the composition, and a plurality of elements fabricated from a p-type thermoelectric material, wherein the elements are arranged in an alternating configuration, and are electrically coupled in series and are thermally coupled in parallel.

23. A power generation device comprising at least two heat transfer plates, a composition disposed between the heat transfer plates, a p-type thermoelectric material disposed between the heat transfer plates, and electrical conductors connected to the composition and to the p-type thermoelectric material, wherein a first heat transfer plate is exposed to a first temperature, and a second heat transfer plate is exposed to a second temperature that is different from the first temperature; wherein the composition has skutterudite cubic lattice structure and is described by the formula $Co_{4-m}A_mSb_{12-n}X_n In_xM_y$, where A is selected from one or more members of the group consisting of Fe, Ni, Ru, Rh, Pd, Ir and Pt; X is selected from one or more members of the group consisting of Si, Ga, Ge and Sn; M is selected from one or more members of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu; $0 \leq m \leq 1$; $0 \leq n \leq 9$; $0 < x < 1$; $0 < y < 1$; and $0 < x+y \leq 1$.

24. A device according to claim 23 wherein the composition is comprised of a purality of cubic unit cells, wherein
    (a) the cubic lattice of a first cubic unit cell is comprised of Co, or Co and one or more members of the group consisting of Fe, Ni, Ru, Rh, Pd, Ir and Pt;
    (b) the first cubic unit cell is comprised of atomic crystallograhphic sites arranged in eight subcells;
    (c) six subcells in the first cubic unit cell are comprised of Sb, or Sb and one or more members of the group consisting of Si, Ga, Ge and Sn;
    (d) a seventh subcell in the first cubic unit cell is comprised of In; and
    (e) an eighth subcell in the first cubic unit cell is comprised of a member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu.

25. A device according to claim 24 wherein the composition has a second cubic unit cell, wherein
    (a) the cubic lattice of the second cubic unit cell is comprised of Co, or Co and one or more members of the group consisting of Fe, Ni, Ru, Rh, Pd, Ir and Pt;
    (b) the second cubic unit cell is comprised of atomic crystallograhphic sites arranged in eight subcells;
    (c) six subcells in the second cubic unit cell are comprised of Sb, or Sb and one or more members of the group consisting of Si, Ga, Ge and Sn;
    (d) a seventh subcell in the second cubic unit cell is comprised of In; and
    (e) an eighth subcell in the second cubic unit cell is comprised of a different member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu than the eighth subcell in the first cubic unit cell.

26. A device according to claim 24 wherein the composition has a second cubic unit cell, wherein
    (a) the cubic lattice of the second cubic unit cell is comprised of Co, or Co and one or more members of the group consisting of Fe, Ni, Ru, Rh, Pd, Ir and Pt;
    (b) the second cubic unit cell is comprised of atomic crystallograhphic sites arranged in eight subcells;
    (c) six subcells in the second cubic unit cell are comprised of Sb, or Sb and one or more members of the group consisting of Si, Ga, Ge and Sn;
    (d) a seventh subcell in the second cubic unit cell is comprised of In; and
    (e) an eighth subcell in the second cubic unit cell is comprised of In.

27. A device according to claim 24 wherein the composition has a second cubic unit cell, wherein
    (a) the cubic lattice of the second cubic unit cell is comprised of Co, or Co and one or more members of the group consisting of Fe, Ni, Ru, Rh, Pd, Ir and Pt;
    (b) the second cubic unit cell is comprised of atomic crystallograhphic sites arranged in eight subcells;

(c) six subcells in the second cubic unit cell are comprised of Sb, or Sb and one or more members of the group consisting of Si, Ga, Ge and Sn;

(d) a seventh subcell in the second cubic unit cell is comprised of a member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu; and (e) an eighth subcell in the second cubic unit cell is comprised of a member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu.

28. A device according to claim 27 wherein the seventh and eighth subcells of the second cubic unit cell are comprised of the same member of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu.

29. A device according to claim 27 wherein the seventh and eighth subcells of the second cubic unit cell are comprised of different members of the group consisting of Ca, Sc, Zn, Sr, Y, Pd, Ag, Cd, Ba, La, Ce, Pr, Nd, Sm, Eu, Gd, Tb, Dy, Ho, Er, Tm, Yb and Lu.

30. A device according to claim 24 wherein the cubic lattice of the first cubic unit cell is comprised of Co and one or more members of the group consisting of Fe, Ni, Ru, Rh, Pd, Ir and Pt.

31. A device according to claim 24 wherein six subcells in the first cubic unit cell are comprised of 4-member planar rings comprised of Sb and one or more members of the group consisting of Si, Ga, Ge and Sn.

32. A device according to claim 24 wherein an eighth subcell in the first cubic unit cell is comprised of a member of the group consisting of Sc, La, Ce, Yb, Nd, Pd and Y.

33. A device according to claim 23 which comprises a plurality of elements fabricated from the composition, and a plurality of elements fabricated from a p-type thermoelectric material, wherein the elements are arranged in an alternating configuration, and are electrically coupled in series and are thermally coupled in parallel.

* * * * *